United States Patent
Emrick et al.

(10) Patent No.: US 7,696,837 B2
(45) Date of Patent: Apr. 13, 2010

(54) RF SYSTEM HAVING A ONE-DIMENSIONAL NANOSTRUCTURE MULTI-PORT COUPLER

(75) Inventors: Rudy M. Emrick, Gilbert, AZ (US); Islamshah S. Amlani, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 82 days.

(21) Appl. No.: 12/022,257

(22) Filed: Jan. 30, 2008

(65) Prior Publication Data

US 2009/0189711 A1 Jul. 30, 2009

(51) Int. Cl.
- *H01P 5/12* (2006.01)
- *H01P 3/10* (2006.01)
- *B82B 1/00* (2006.01)

(52) U.S. Cl. ............. 333/24 R; 333/238; 977/750; 977/932

(58) Field of Classification Search ............. 333/1, 333/24 R, 238, 248; 977/700, 701, 712, 977/720, 762, 778, 785, 788, 789, 796, 750, 977/932

See application file for complete search history.

(56) References Cited

U.S. PATENT DOCUMENTS 7,274,208 B2 * 9/2007 DeHon et al. ............. 326/38
7,292,498 B2 * 11/2007 Snider .................. 365/230.02
7,310,004 B2 * 12/2007 DeHon ....................... 326/41
7,488,950 B2 * 2/2009 Mouttet ..................... 250/397

OTHER PUBLICATIONS

Zhu, Lingbo, et al., Controlled Growth of Well-Aligned Carbon Nanotubes and Their Assembly, 1-4244-0261, IEEE, pp. 123-127, Jan. 2006.

Highstrete, Clark, et al., Microwave dissipation in arrays of single-wall carbon nanotubes, Applied Physics Letters, 89. 173015, 2006.

* cited by examiner

*Primary Examiner*—Dean O Takaoka

(57) ABSTRACT

A one-dimensional nanostructure multi-port coupler (100, 300, 400, 600) is provided for use in an RF device (700). The coupler (100, 300, 400, 600) includes a first plurality of one-dimensional nanostructures (102) aligned substantially in a first direction (110) and coupled between the input (103) and first output (103'), and a second plurality of one-dimensional nanostructures (104) substantially aligned in a second direction (112), coupled to a second output (105), and disposed contiguous to the first plurality of one-dimensional nanostructures (102). The first and second plurality of one-dimensional nanostructures (102, 104) may comprise first and second contiguous planes. The amount of RF energy coupled may be controlled by varying the width, density, diameter, and type of one of the plurality of one-dimensional nanostructures (102, 104) versus the other. The amount of RF energy coupled may also be controlled by varying the angle between the first and second plurality of one-dimensional nanostructures (102, 104) and by disposing a dielectric material (132) therebetween.

16 Claims, 3 Drawing Sheets

RF SYSTEM HAVING A ONE-DIMENSIONAL NANOSTRUCTURE MULTI-PORT COUPLER

FIELD

The present invention generally relates to RF devices and more particularly to a method and apparatus for sampling an RF signal.

BACKGROUND

RF devices conventionally employ couplers for sampling an RF signal combining signals asymmetrically for line monitoring, power measurements, and load source isolators. Couplers comprise three basic types of devices: unidirectional, bidirectional, and dual directional.

Unidirectional RF couplers are four-port devices with a main line having an input and an output, and a coupled line with a terminated input and a coupled output. The power passing to the output on the main line is combined with the coupled output, but the coupled output is isolated from the main line output. Any reflected power from the main line output is coupled to the termination.

Bidirectional RF couplers are similar to unidirectional couplers, but do not provide termination on the fourth port (coupled input). Main line power is coupled to the forward output of secondary line and reflected power is coupled to the reflected output. For isolation to be achieved, coupled outputs must be obtained through well-matched terminations at each port.

Dual directional RF couplers are four-port devices that have two unidirectional couplers. They can be connected back-to-back in series, with the main line output of the forward coupler connected to the output of the second coupler; or integrated into one device with a single main line and two secondary lines. Integration in a single device provides several advantages, including a shorter or more compact unit. In addition, since there is only one main line, insertion loss is reduced and high isolation is more easily attained.

Selecting RF couplers requires an analysis of performance specifications. Continuous wave (CW) average power measures one-way transmissions through the main line under matched load conditions. Coupling is the ratio of the power measured at the output port relative to that measured at the forward coupled port. Directivity is the ratio of the power measured at the reverse coupled port relative to that measured at the forward coupled port when the output port is ideally terminated. Insertion loss is the total RF power transmission loss resulting from the insertion of a device in a transmission line. It is defined as the ratio of signal power at the output of the inserted device to the signal power at the input of the inserted device. Coupling, directivity, and insertion loss are all measured in decibels (dB). Voltage standing wave ratio (VSWR) is a unitless ratio ranging from 1 to infinity that expresses the amount of reflected energy at the input of the device. A value of 1 indicates that all of the energy passes through. Any other value indicates that a portion of the energy is reflected. Other performance specifications for RF couplers include frequency range, return loss, and reflected power.

These known couplers, including for example adjacent strip lines, require well controlled gaps that require complex manufacturing techniques. Known mult-port couplers include multiple strip lines spaced around a ring. Contamination between the gaps may contribute to poor efficiency of the coupling.

Accordingly, it is desirable to provide a multi-port coupler for use in an RF device that does not require controlled gaps between adjacent conductors. Furthermore, other desirable features and characteristics of the present invention will become apparent from the subsequent detailed description and the appended claims, taken in conjunction with the accompanying drawings and this background.

BRIEF DESCRIPTION OF THE DRAWINGS

Embodiments of the present invention will hereinafter be described in conjunction with the following drawing figures, wherein like numerals denote like elements.

DETAILED DESCRIPTION

Figure 1:
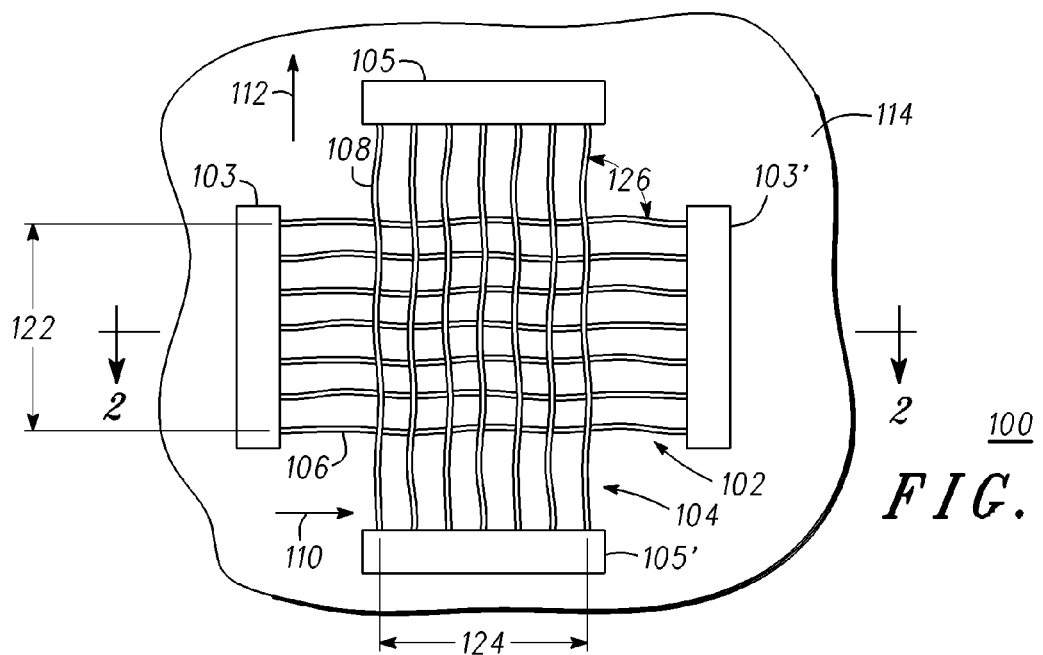
FIG. 1 is a top view of a multiport coupler in accordance with a first exemplary embodiment.

The following detailed description is merely exemplary in nature and is not intended to limit the invention or the application and uses of the invention. Furthermore, there is no intention to be bound by any theory presented in the preceding background or the following detailed description.

One-dimensional nanostructures such as nanotubes and nanowires show promise for the development of molecular-scale devices used in, e.g., RF devices, displays, resonators, and logic/memory elements. One-dimensional nanostructures are herein defined as a material having a high aspect ratio of greater than 10 to 1 (length to diameter) and includes, either single or bundled, at least carbon nanotubes with a single wall or a limited number of walls, carbon nanofibers, carbon nanowires, and metallic nanowires.

One-dimensional nanostructures such as nanotubes, nanowires, and their arrays show promise for the development of macro-sized RF devices. One of the well-known ways for preparation of these one-dimensional nanostructures is by chemical vapor deposition (CVD) which allows for the growth of high quality nanotubes by controlling the size, location, and pattern of catalytic nanoparticles. The growth direction of the nanotubes can be furthermore controlled by plasma-enhanced CVD processing. For example, the diameters of multi-walled nanotubes are typically proportionally related to the sizes of the catalytic nanoparticles used in the CVD process.

Carbon is one of the most important known elements and can be combined with oxygen, hydrogen, nitrogen and the like. Carbon has four known unique crystalline structures including diamond, graphite, fullerene and carbon nanotubes. In particular, carbon nanotubes typically refer to a helical tubular structure grown with a single wall or multi-wall, and commonly referred to as single-walled nanotubes (SWNTs), or multi-walled nanotubes (MWNTs), respectively. These types of one-dimensional nanostructures are obtained by rolling a sheet formed of a plurality of hexagons. The sheet is formed by combining each carbon atom thereof with three neighboring carbon atoms to form a helical tube. Single wall carbon nanotubes typically have a diameter in the order of a fraction of a nanometer to a few nanometers. Multiwall carbon nanotubes typically have an outer diameter in the order of a few nanometers to several hundreds of nanometers, depending on inner diameters and numbers of layers. Each layer is still a single wall of the nanotube. The multi-wall carbon nanotube with large diameter is generally longer.

Carbon nanotubes can function as either a conductor, like metal, or a semiconductor, according to the rolled shape (chirality) and the diameter of the helical tubes. With metallic-like nanotubes, a carbon-based structure can conduct a current in one direction at room temperature with essentially ballistic conductance so that metallic-like nanotubes can be used as ideal interconnects, RF signal receptors, and radiation elements. It is also found that the band gap of certain chiralities of carbon nanotube is inversely proportional to the tube diameter. Therefore, it is necessary to keep the tube diameter small for semiconducting single wall nanotubes. Instead, a multiwall carbon nanotube with large diameter, in general, is metallic in nature. Such super metallic property is desirable to the design of one-dimensional nanostructures. Therefore, carbon nanotubes are potential building blocks for nanoelectronics devices due to their unique structural, physical, and chemical properties.

In addition to CVD, other approaches include forming a suspension of nanotubes in a preferred solvent and dispensing it a on a substrate of choice. Devices and circuits can be formed by selectively etching nanotubes from undesirable areas on the substrate.

Selectively assembly of nanotubes can also be performed by an alternate current dielectrophoresis technique in which an AC field of a predetermined strength is applied between a pair of electrodes while a nanotube solution is dispensed on the substrate. Nanotubes then selectively form a network in between the electrodes.

For some applications it is desirable to form a dense and aligned network of nanotubes on a substrate. It has been shown that such aligned networks can be achieved by chemical vapor deposition technique if the crystal plain of quartz or sapphire is oriented in a certain direction. Post-growth, these aligned nanotubes may be transferred to a wide range of substrates. The approach includes guided growth of nanotubes on an appropriately cut quart or sapphire substrate, followed by a sequential transfer of the resulting collections of tubes to target substrates such as dielectrics, semiconductors and flexible substrates such as polyamide and other plastics. Multiple transfers can also be performed to arrange groups of aligned nanotubes in various orientations; one on top of the other. This approach enables the formation of large scale multilayer superstructures of complex layouts of nanotubes on a variety of substrates.

Another class of one-dimensional nanostructures is nanowires. Nanowires of inorganic materials have been grown from metal (e.g., Ag, Au, Cu, Al) and other metal alloys, elemental semiconductors (e.g., Si, and Ge), III-V semiconductors (e.g., GaAs, GaN, GaP, InAs, and InP), II-VI semiconductors (e.g., CdS, CdSe, ZnS, and ZnSe) and oxides (e.g., $SiO_2$ and ZnO). Similar to carbon nanotubes, inorganic nanowires can be synthesized with various diameters and length, depending on the synthesis technique and/or desired application needs.

One-dimensional nanostructures such as nanotubes and nanowires show promise for the development of molecular-scale RF couplers used in, e.g., transmitters and receivers.

In accordance with the exemplary embodiments, an RF signal is directed through a first plurality of aligned one-dimensional nanostructures disposed in a first plane, and a sample of the RF signal is sensed by a second plurality of aligned one-dimensional nanostructures disposed in a second plane. The first and second plurality of aligned one-dimensional nanostructures is disposed at some angle to one another (orthogonal in one exemplary embodiment) and may be separated by a dielectric layer. An additional plurality of aligned one-dimensional nanostructures may be used for a multi-port coupler of another exemplary embodiment. Several factors determine the amount of power coupled from one plurality of aligned one-dimensional nanostructures to another, including the width of each plurality of one-dimensional nanostructures, the density of each plurality of one-dimensional nanostructures, the angle between each plurality of the one-dimensional nanostructures, the type of one-dimensional nanostructure, and whether a dielectric material, and the type of dielectric material, is disposed between the first and second plurality of one-dimensional nanostructures.

Figure 2:
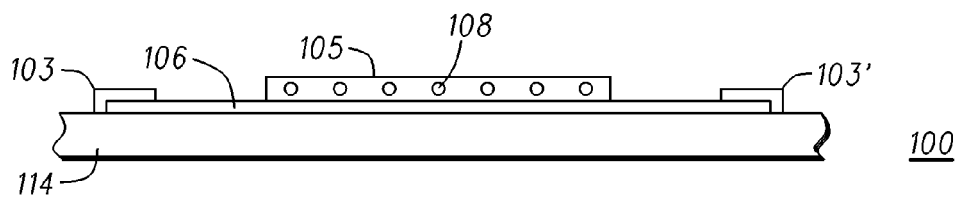
FIG. 2 is a partial cross section taken along line 2-2 of FIG. 1.

Referring to FIGS. 1 and 2, a one-dimensional nanostructure coupler 100 includes a pair of aligned nanostructures 102, 104. One-dimensional nanostructures 102 include a plurality of aligned one-dimensional nanostructures 106 substantially aligned in a first direction 110 between connectors 103, 103'. One-dimensional nanostructures 104 includes a second plurality of one-dimensional nanostructures 108 substantially aligned in a second direction 112 between connectors 105, 105' and are disposed contiguous to the one-dimensional nanostructures 106. Not all of the one-dimensional nanostructures 106 may be touching all of the one-dimensional nanostructures 108. For example, each of the one-dimensional nanostructures 106 may touch any number of the one-dimensional nanostructures 108 or simply be disposed near the one-dimensional nanostructures 108. An RF signal is applied to, or taken from, the one-dimensional nanostructures 106, 108 via any known connector for which the connectors 103, 103', 105, 105' represent, for example, a distributed electromagnetic coupling. Although some aligned one-dimensional nanostructures 106 may touch adjacent one-dimensional nanostructures 106, and some aligned one-dimensional nanostructures 108 may touch adjacent one-dimensional nanostructures 108, each one-dimensional nanostructures 106, 108 will extend between respective connectors 103, 103', 105, 105'. The one-dimensional nanostructures may be formed in any known manner, for example, grown on the substrate 114 or grown and then placed thereon. The one-dimensional nanostructures 106, 108 preferably will be of a determined length for the frequency of the particular application. For microwave transmissions, the length of the one-dimensional nanostructures 106, 108 would typically be in the range of 0.5 centimeters to 2.0 centimeters, though the length may be outside of this range for some applications. For millimeter wave transmissions, the typical length of the one-dimensional nanostructures 106, 108 would be in the range of 0.05 millimeter to 0.5 centimeter. For terahertz and beyond terahertz transmissions, the typical length of the one-dimensional nanostructures 106, 108 would be in the range of 1.0 nanometer to 0.05 millimeter. The substrate 114 may comprise most any substrate including known in the semiconductor industry, e.g., glass, silicon, gallium arsenide, indium phosphide, silicon carbide, gallium nitride, silicon oxide, aluminum oxide, carbon, and flexible materials such as Mylar® and Kapton®, but more preferably for high frequency applications comprises a material having high resistivity such as quartz or sapphire. The substrate 114 may be positioned on a PWB substrate (not shown) preferably comprising fiberglass reinforced resin types (such as FR-4), low temperature co-fired ceramic (LTCC), liquid crystal polymer (LCP), and Teflon impregnated mesh types. The substrate 100 may also include control electronics or other circuitry (not shown), and may also include an insulating layer (not shown), such as silicon dioxide, silicon nitride, quartz, or the like. A layer (not shown), e.g., a catalyst, may be formed on the substrate 114 for growing the one-dimensional nanostructures 106, 108. Examples of suitable catalytic material (which may comprise catalytic nanoparticles) for the catalytic layer for nanostructure growth include titanium, vanadium, chromium, manganese, copper, zirconium, niobium, molybdenum, silver, hafnium, tantalum, tungsten, rhenium, gold, ruthenium, rhodium, palladium, osmium, iridium, platinum, nickel, iron, cobalt, or a combination thereof. More particularly for carbon nanotube growth, examples include nickel, iron, and cobalt, or combinations thereof.

Though the one-dimensional nanostructures 106, 108 may be grown by any method known in the industry, one preferred way of growing carbon nanotubes is as follows. A chemical vapor deposition (CVD) is performed by exposing the structure 114 (including a catalyst) to hydrogen ($H_2$) and a carbon containing gas, for example methane ($CH_4$), between 450° C. and 1,000° C., but preferably between 550° C. and 850° C. CVD is the preferred method of growth because the variables such as temperature, gas input, and catalyst may be controlled. Carbon nanotubes 106, 108 are thereby grown from the substrate 114 forming a single nanostructures or a network (i.e., mesh) of connected carbon nanotubes 106, 108. Although only a few carbon nanotubes 106, 108 are shown, those skilled in the art understand that a large number of carbon nanotubes 106, 108 could be grown. The nanostructures 106, 108 may be grown in any manner known to those skilled in the art, and are grown to a desired length and diameter. Furthermore, the carbon nanotubes 106, 108 may be coupled by vias or air-bridges, for example, to other points within an integrated circuit residing on the substrate. The nanostructures may also be transferred to the structures 114 using well developed techniques.

Resistance anisotropy in materials or thin films occurs when the resistance in one direction, for example, longitudinal, is different than the resistance in another (e.g. horizontal). Examples of this have been reported in the literature with directionally aligned carbon nanotube mats. The shortcoming of the previously reported approaches of resistance anisotropy in carbon nanotube films is that the ratio of anisotropy is limited.

Current will flow easily in each of the directions 110, 112, but not orthogonal to their directions unless they overlay, as shown in 114. When the two arrays of one-dimensional nanostructures 102 and 104 are overlayed, some amount of current will couple to the orthogonal direction due to contact and/or capacitive coupling between one-dimensional nanostructures 102 and 104. The amount of current that is coupled can be controlled by the density of one-dimensional nanostructures 102 and 104. If the RF through one-dimensional nanostructures 102 is a direction 110 where some amount of the current or RF energy in the path of 104 is to be sampled, the densities of 102 and 104 can be selected to enable such. If the density of one-dimensional nanostructures 102 is substantially less than one-dimensional nanostructures 104, then the current coupled in the direction 110 from one-dimensional nanostructures 104 will be a fraction of what is in the direction 112. If density of both one-dimensional nanostructures 102 and 104 is high and substantially the same, the coupled current or energy to connectors 103 and 103' will be substantially the same as is coupled to connector 105' when the signal input is applied to connector 105. This will be the case as long as the overall dimensions of one-dimensional nanostructures 102 and 104 are such that their RF impedance and other characteristics are designed in keeping with well know good practices so that each is properly impedance matched.

Figure 3:
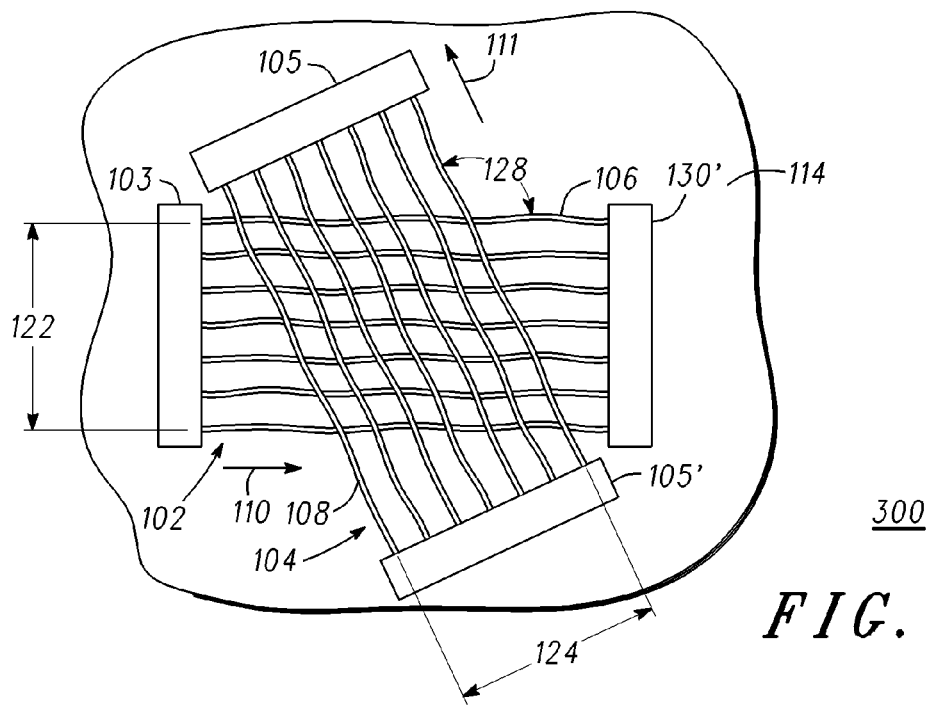
FIG. 3 is a top view of a multiport coupler in accordance with a second exemplary embodiment.

Although the one-dimensional nanostructures 106, 108 are shown as being orthogonal in FIG. 1, they may be at some other angle to one another. FIG. 3 is a second exemplary embodiment wherein the one-dimensional nanostructures 106, 108 are at an angle 128 to one another, with the one-dimensional nanostructures 106 aligned in the direction 110 and the one-dimensional nanostructures 108 aligned in another direction 111.

Figure 4:
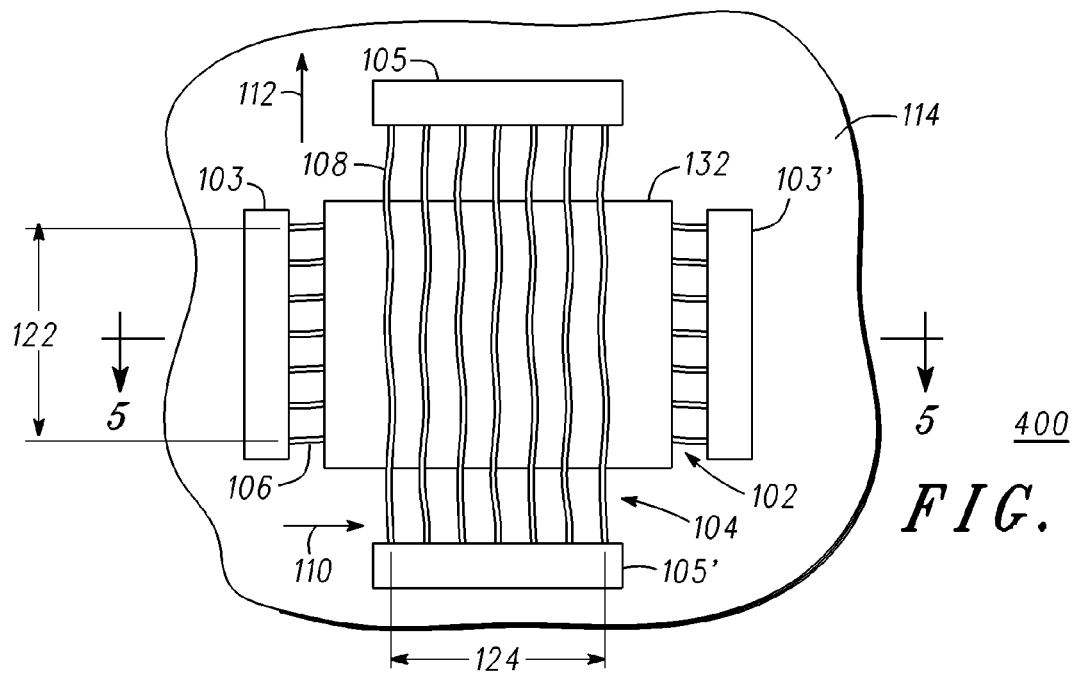
FIG. 4 is a top view of a multiport coupler in accordance with a third exemplary embodiment.
Figure 5:
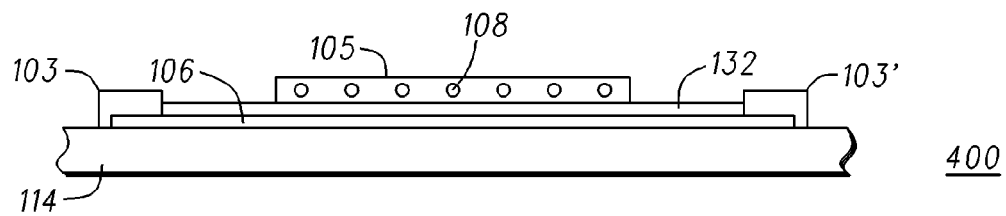
FIG. 5 is a partial cross section taken along line 5-5 of FIG. 4.

And although the aligned nanostructures 106, 108 are shown as being in contact with one another in FIG. 1, they may be separated by a dielectric layer 132 as may be seen in FIGS. 4 and 5. The dielectric layer 132 may be any non-conductive material, for example, glass, silicon, gallium arsenide, indium phosphide, silicon carbide, gallium nitride, carbon, silicon dioxide, silicon nitride, aluminum oxide, hafnium oxide, zirconium oxide, aluminum oxide and flexible materials such as Mylar® and Kapton®, but more preferably for high frequency applications comprises a material having high resistivity such as quartz or sapphire.

Figure 6:
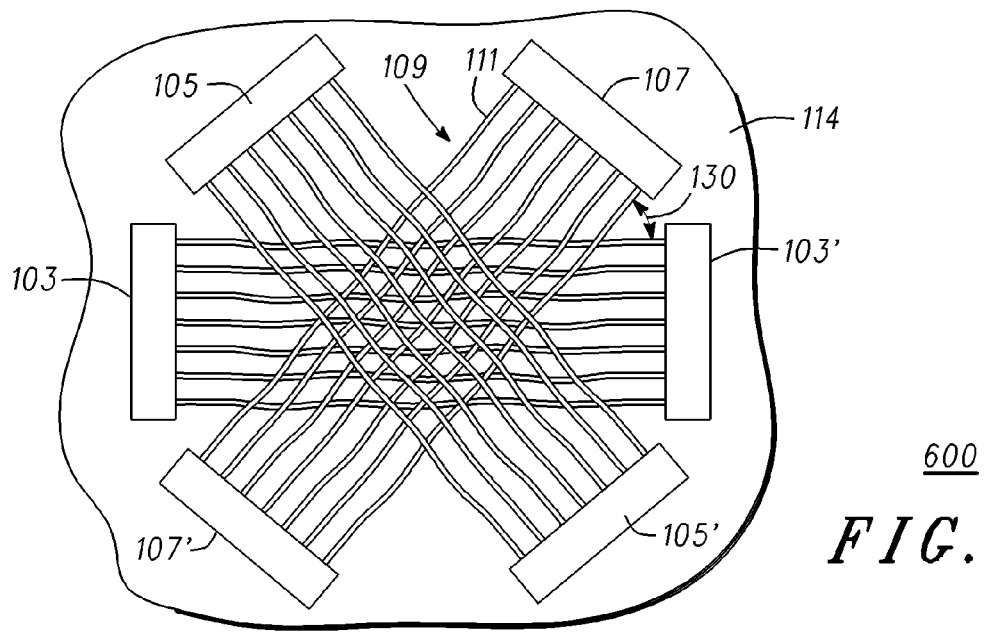
FIG. 6 is a top view of a multiport coupler in accordance with a third exemplary embodiment.

Referring to FIG. 6, a third exemplary embodiment includes a third set of aligned nanostructures 109 including a plurality of one-dimensional nanostructures 111 disposed at an angle 130 to the one-dimensional nanostructures 106.

As previously mentioned, several factors determine the amount of power coupled from one plurality of nanostructures 106 to another plurality of nanostructures 108. For this exemplary embodiments of FIGS. 1-3 and 6, these factors include the width 122, 124 of each plurality of one-dimensional nanostructures 106, 108, 109, the density of each plurality of one-dimensional nanostructures 106, 108, 109, the diameter of each plurality of one-dimensional nanostructures 106, 108, 109, the angle 126, 128, the angle between each plurality of the one-dimensional nanostructures 106, 108, 109, the type of one-dimensional nanostructure 106, 108, 109 (including whether metal or carbon, and single walled nanotubes or multi-walled nanotubes), and, for the exemplary embodiment of FIGS. 4 and 5, whether a dielectric material, and the type of dielectric material, is disposed between the first and second plurality of one-dimensional nanostructures. As is well known for RF transmission lines, the overall widths and lengths 122, 124 will, in combination with the substrate material and thickness, determine the characteristic impedance of the transmission line. The widths and lengths of conductors 105 and 103 should be selected so that the overall multi-port device has sufficiently good impedance match so that it can operate efficiently and allow sufficient power to couple into and out of each appropriate port. The density of one-dimensional nanostructures 102 and 104 can also be selected to determine how much power is coupled to each of the output ports in combination with the impedance of each. The density of one-dimensional nanostructures 102 and 104 can be used to control and effective couple factor between the orthogonal paths in the coupler 100, though this also applies to other exemplary embodiments such as couplers 300 and coupler 600. If, for example, it is intended to sample a small portion of the RF signal inserted at port 105 to ports 103 and 103', the density of 104 would be substantially higher than 102, so that the device operates predominantly like a through between 105 and 105' with a small amount of the power inserted at port 105 coupled to 103 and 103'. There are, of course, a large number of variations of such couplers including the number and configuration of ports.

Figure 7:
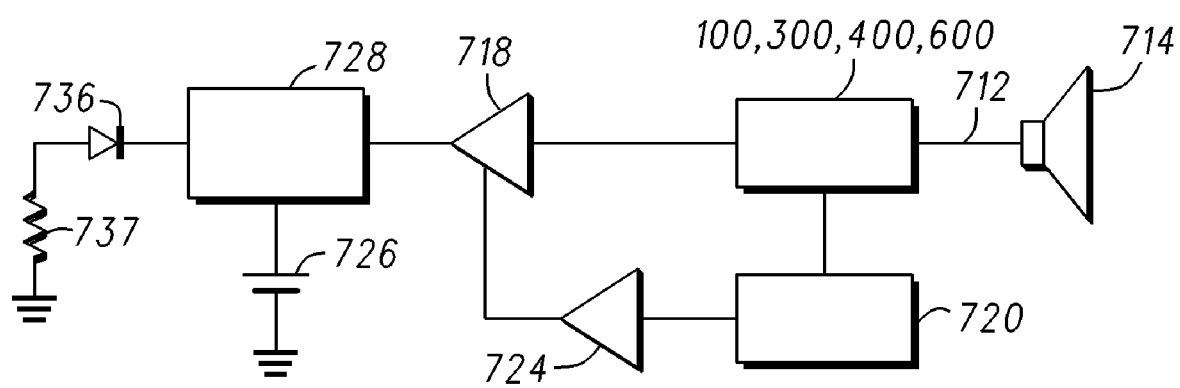
FIG. 7 is a schematic of an RF adaptive responsivity detector system including a multiport coupler.

Referring to FIG. 7, the coupler 100, 300, 400, 600 within an RF adaptive responsivity detector system 700 includes an input conductor 712 configured, for example to be coupled to an antenna 714, for providing a received signal to the coupler 100, 300, 400, 600. The received signal having a carrier frequency, for example in the range up to 3.0 THz, but preferably of approximately 60 GHz, is forwarded from the input conductor 712 to a low noise amplifier 718 by one-dimensional nanostructures 102. The received RF signal is envelope detected using RF envelope detector 728. The RF envelope detector 728 comprises the bias tee circuit (not shown) coupled between a diode 736 and the low noise amplifier 718. A load at the output of the envelope detector 728 is represented by a resistor 737. This bias tee circuit serves to isolate a DC input bias to the envelope detector diode 34 from the RF carrier frequency. A bias 726 applied to RF envelope detector 728 may be used to control the responsivity of the detector.

The coupler 100, 300, 400, 600 may be implemented in accordance with the exemplary embodiments, but preferably in a manner consistent with integration on a common substrate. This coupling factor, or relative signal sampled by the coupling, is preferably at least 10 dB reduced from the original signal to minimize impact on receiver sensitivity. A power detector 720 transforms power (RF signal from the coupler 100, 300, 400, 600) into a DC voltage proportional to the received power at the antenna. This DC voltage can be converted by a differential amplifier 724 into a control signal that is applied to the detector 728 to vary the responsivity/sensitivity adaptively in relation to the received power at the antenna 714. Therefore, as power increases at the antenna 714, the responsivity of the envelope detector 728 decreases, or as power decreases at the antenna 714, the responsivity of the envelope detector 728 increases. The use of a DC bias voltage to control the responsivity of the envelope detector 728 allows for improved dynamic range over conventional RF detector systems.

Using a highly nonlinear diode as the diode 36, for example, a Schottky diode, allows for very high frequency detection. The integrated RF variable responsivity detector 700 may be fabricated on non-semiconductor substrates such as FR-4 boards or any material including, for example, quartz, ceramics, Teflon®, polyimides, plastic, liquid crystal polymer, and epoxy. Improved performance is accomplished by eliminating or reducing lossy interconnects, and positioning the demodulator in the vicinity of the antenna.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A coupler for sensing an RF signal, the coupler comprising:
   a first plurality of one-dimensional nanostructures aligned substantially in a first direction and substantially in a first plane; and
   a second plurality of one-dimensional nanostructures aligned substantially in a second direction and substantially in a second plane substantially parallel to the first plane and disposed contiguous to the first plurality of one-dimensional nanostructures;
   wherein the first plurality of one-dimensional nanostructures have a first density and the second plurality of one-dimensional nanostructures have a second density.

2. The coupler of claim 1 wherein the first plurality of one-dimensional nanostructures have a first diameter and the second plurality of one-dimensional nanostructures have a second diameter.

3. The coupler of claim 1 wherein the first plurality of one-dimensional nanostructures have a first width and the second plurality of one-dimensional nanostructures have a second width.

4. The coupler of claim 1 wherein the first and second planes are substantially parallel and the first plurality of one-dimensional nanostructures are disposed at an angle to the second plurality of one-dimensional nanostructures.

5. The coupler of claim 1 wherein the first plurality of one-dimensional nanostructures comprise a first number and the second plurality of one-dimensional nanostructures comprise a second number.

6. The coupler of claim 1 further comprising a dielectric layer disposed between the first and second plurality of one-dimensional nanostructures.

7. The coupler of claim 1 wherein the first and second plurality of one-dimensional nanostructures comprise a carbon material.

8. The coupler of claim 1 wherein the first and second plurality of one-dimensional nanostructures comprise carbon nanotubes.

9. An RF system comprising:
   an input;
   a first output;
   a second output; and
   a coupler comprising:
      a first plurality of one-dimensional nanostructures aligned substantially in a first direction and coupled between the input and the first output; and
      a second plurality of one-dimensional nanostructures substantially aligned in a second direction, coupled to the second output, and disposed contiguous to the first plurality of one-dimensional nanostructures;
      wherein the first plurality of one-dimensional nanostructures have a first width and the second plurality of one-dimensional nanostructures have a second width.

10. The RF system of claim 9 wherein the first plurality of one-dimensional nanostructures have a first diameter and the second plurality of one-dimensional nanostructures have a second diameter.

11. The RF system of claim 9 wherein the first plurality of one-dimensional nanostructures have a first density and the second plurality of one-dimensional nanostructures have a second density.

12. The RF system of claim 9 wherein the first plurality of one-dimensional nanostructures are disposed at an angle to the second plurality of one-dimensional nanostructures.

13. The RF system of claim 9 further comprising a dielectric layer disposed between the first and second plurality of one-dimensional nanostructures.

14. The RF system of claim 9 wherein the first and second plurality of one-dimensional nanostructures comprise a carbon material.

15. The RF system of claim 9 wherein the first and second plurality of one-dimensional nanostructures comprise carbon nanotubes.

16. The RF system of claim 9 wherein the first plurality of carbon nanotubes comprise a first bundle and the second plurality of carbon nanotube comprise a second bundle.

* * * * *